US009160825B2

(12) United States Patent
Saji et al.

(10) Patent No.: US 9,160,825 B2
(45) Date of Patent: *Oct. 13, 2015

(54) COMMUNICATION MODULE

(71) Applicant: TAIYO YUDEN CO., LTD., Tokyo (JP)

(72) Inventors: Tetsuo Saji, Tokyo (JP); Yohei Ichikawa, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 41 days.

This patent is subject to a terminal disclaimer.

(21) Appl. No.: 14/481,779

(22) Filed: Sep. 9, 2014

(65) Prior Publication Data

US 2015/0119102 A1    Apr. 30, 2015

Related U.S. Application Data

(63) Continuation-in-part of application No. 14/199,824, filed on Mar. 6, 2014, now Pat. No. 8,849,362.

(30) Foreign Application Priority Data

Oct. 30, 2013  (JP) ................................. 2013-225216
Mar. 18, 2014  (JP) .................................. 2014-54606

(51) Int. Cl.
*H04M 1/02* (2006.01)
*H04B 1/38* (2015.01)
(Continued)

(52) U.S. Cl.
CPC ................. *H04M 1/026* (2013.01); *H04B 1/38* (2013.01); *H04B 1/3888* (2013.01); *H04B 15/02* (2013.01);
(Continued)

(58) Field of Classification Search
CPC .......... H04M 1/04; H04M 1/026; H04B 1/38; H04B 1/3888; H04B 15/04; H04B 15/02; H05K 1/0218; H05K 3/284; H05K 2201/0715; H05K 2201/10371; H01L 2924/0002

USPC .................................. 455/575.1; 257/659, 660
See application file for complete search history.

(56) References Cited

U.S. PATENT DOCUMENTS

| 2011/0304388 | A1  | 12/2011 | Yamawaki et al. |
| 2011/0310585 | A1* | 12/2011 | Suwa et al. ................... 361/820 |
| 2012/0139091 | A1* | 6/2012  | Wakabayashi ................ 257/659 |
| 2012/0306062 | A1* | 12/2012 | Kim et al. ..................... 257/659 |
| 2013/0012261 | A1* | 1/2013  | Zhu et al. .................. 455/550.1 |
| 2013/0257462 | A1* | 10/2013 | Ding et al. .................... 324/705 |

FOREIGN PATENT DOCUMENTS

| JP | H7-42187 U     | 7/1995  |
| JP | 2005-277939 A  | 10/2005 |

(Continued)

OTHER PUBLICATIONS

Japanese Office Action dated Dec. 11, 2013, in a counterpart Japanese patent application No. 2013-236650. (PPH supporting document. Cited in the parent U.S. Appl. No. 14/199,824.).

*Primary Examiner* — Andrew Wendell
*Assistant Examiner* — Maryam Soltanzadeh
(74) *Attorney, Agent, or Firm* — Chen Yoshimura LLP

(57) ABSTRACT

A communication module includes a circuit substrate having a first high-frequency processing section related to mobile phone communication, a second high-frequency processing section that processes reception signals related to satellite positioning systems, a system section having a baseband processing section and application processing section, and a power circuit section, a sealing member covering the electronic components mounted on the circuit substrate, a conductive shield layer formed on a surface of the sealing member, and a shield wall formed in the sealing member so as to demarcate a mounting area of the first high-frequency processing section and a mounting area of the second high-frequency processing section.

8 Claims, 6 Drawing Sheets

(51) Int. Cl.
  *H04B 1/3888* (2015.01)
  *H04B 15/04* (2006.01)
  *H05K 1/02* (2006.01)
  *H04B 15/02* (2006.01)
  *H05K 3/28* (2006.01)

(52) U.S. Cl.
  CPC .............. *H04B 15/04* (2013.01); *H05K 1/0218* (2013.01); *H01L 2924/0002* (2013.01); *H05K 3/284* (2013.01); *H05K 2201/0715* (2013.01); *H05K 2201/10371* (2013.01)

(56) References Cited

FOREIGN PATENT DOCUMENTS

| JP | 2012-4725 A | 1/2012 |
| JP | 5285806 B1 | 9/2013 |

* cited by examiner

COMMUNICATION MODULE

BACKGROUND OF THE INVENTION

1. Field of the Invention

The present invention relates to a communication module used in mobile phones.

2. Description of Related Art

Recently, as shown by multi-functional mobile phones such as the smartphone, the functions of mobile phones are increasing and their size is decreasing. Known examples of such a mobile phone include a mobile phone in which a high-frequency circuit module that has various types of front end components necessary for transmission and reception of high-frequency signals mounted together on a circuit substrate is mounted on a motherboard (see Patent Document 1, for example). The term "front end components" means active or passive components for high-frequency signal processing that are arranged on a route between the high-frequency IC, which processes high-frequency signals, and the antenna. In a high-frequency circuit module disclosed in Patent Document 1, front end components such as a power amplifier IC, transmission filters, and reception filters are mounted on a circuit substrate. Passive components such as a capacitor forming a matching circuit are also embedded in the circuit substrate. The high-frequency circuit module in Patent Document 1 includes two transceiver systems, the digital cellular system operating in the 800 MHz band and the PCS (personal communication services) system operating in the 1.9 GHz band, and one reception system operating in the 1.5 GHz band for reception of GPS (global positioning system) signals in order to use positioning functions by the GPS.

RELATED ART DOCUMENT

Patent Document

Patent Document 1: Japanese Patent Application Laid-Open Publication No. 2005-277939

SUMMARY OF THE INVENTION

Conventional mobile phones, however, are constituted of various types of modules such as high frequency circuit modules, power modules, positioning information modules, or the like, and a baseband signal processing IC, application processing IC, a memory, and the like all mounted on a motherboard. In order to optimize the various types of modules such as the high frequency circuit modules, it was necessary to perform re-adjustments in accordance with the respective combinations of modules in motherboards that have different designs for each purpose. There were also issues due to the increased number of mounting steps. Furthermore, since the respective modules are connected through wiring lines on substrates of the respective motherboards and modules, the routing of signals increases and degradation of signal quality occurs. It is also difficult to decrease the size of the modules as a whole if the modules are each provided with a shield.

Meanwhile, based on the problems concerning conventional mobile phones as described above, there is demand for almost all functions, such as front end components, high frequency IC, power circuit, baseband signal processing circuits, memory, and the like to be provided on a single circuit substrate. However, if the high-frequency circuit module disclosed in Patent Document 1 has the baseband processing circuit, memory, and power circuit mounted thereon, and the total size is reduced, the following problems would occur: (a) characteristic degradation caused by noise mixing between the respective function parts due to the respective function parts being close to each other, (b) a reduction of heat dissipation efficiency due to the respective function parts being close to each other, and (c) susceptibility to warping during mounting due to the circuit substrate being larger than the preceding high-frequency circuit module, even though the size has been reduced.

In regards to problem (a), in this type of device a power circuit for supplying power to the high-frequency circuit and power circuits for the other circuits are provided, and in order for the device to be made smaller the power circuits are switching regulator circuits. Thus, the switching noise generated by the power circuits of the other circuits will electromagnetically couple with the power circuit that supplies power to the high-frequency circuit, resulting in possible degradation of high-frequency characteristics due to the switching noise being transmitted to the high-frequency circuit. It is also possible that the switching noise generated by the power circuit could cause degradation of the high-frequency characteristics by directly electromagnetically coupling with the high-frequency circuit.

The present invention was made in view of the above situation, and aims at providing a mobile phone communication module that is highly functional, compact, and has excellent mounting characteristics.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a communication module that includes a circuit substrate having (a) a first high-frequency processing section that processes high-frequency signals related to mobile phone communication, (b) a system section having a baseband processing area that processes baseband signals related to mobile phone communication and an application processing area that processes various types of mobile phone application operations, and (c) a power circuit section that includes a first power circuit section that supplies power to the first high-frequency processing section and a second power circuit section that supplies power to the system section; a sealing member formed on an entire surface of a main surface of the circuit substrate, the sealing member covering electronic components mounted on said main surface; a shield layer that is conductive and formed on a surface of the sealing member; a first shield wall that fills a groove formed from a main surface of the sealing member toward the main surface of the circuit substrate, the groove demarcating a mounting area of either one or both of the system section and the power circuit section and a mounting area of the first high-frequency processing section, the first shield wall being connected to the shield layer; and a second shield wall that fills a groove formed from the main surface of the sealing member toward the main surface of the circuit substrate, the groove demarcating a mounting area of the first power circuit section and a mounting area of the second power circuit section, the second shield wall being connected to the shield layer.

According to the present invention, many of the primary function parts necessary for a mobile phone are integrated in one module; therefore, it is possible for this configuration to be highly functional and compact. The communication module according to the present invention is optimized and includes primary functions, and thus minimizes effects caused by differences in design of the respective models. This can ease the burden of readjustments on the motherboard where the modules are mounted. In the present invention, the primary functions are all mounted together, thereby making it possible to reduce the number of mounting steps. Furthermore, connection of the primary functions is only performed through the circuit substrate of the modules; therefore, there is less routing of the signals and degradation of signal quality can be alleviated. The present invention uses a shielding wall structure, and thus is made compact with ease. In particular, it is possible to prevent interference of high frequency reception signals related to satellite positioning systems for mobile phone communication in the present invention.

In the present invention, a groove is formed in the sealing member formed on a main surface of the circuit substrate, which is the component mounting surface, so as to demarcate the mounting area of the first high-frequency processing section and the mounting area of the second high-frequency processing section. The first shield wall is filled into this groove. This can prevent noise from entering the second high-frequency processing section from the first high-frequency processing section; thus, a configuration with excellent high-frequency characteristics is achieved. Furthermore, noise generated in the second power circuit section can be prevented by the second shield wall from entering into the first high-frequency processing section via the first power circuit section, which makes it possible to effectively prevent degradation of the high-frequency circuits. In the present invention, a sealing material that covers the electronic components is formed on one entire surface of the circuit substrate. Therefore, this sealing member allows for a high heat dissipation efficiency. Furthermore, warping of the circuit substrate can be suppressed by choosing a suitable sealing material. A communication module according to the present invention as described above can prevent characteristic degradation of high-frequency circuits, have high heat dissipation efficiency, and be resistant to warping regardless of many of the necessary primary function parts of the mobile phone being mounted together.

One example of a preferred aspect of the present invention includes a second shield wall that is electrically connected to the shielding layer and that fills in a groove, the groove being formed towards the one primary surface side of the circuit substrate from the primary surface of the sealing member so as to demarcate one or both mounting areas of the system section and the power circuit section, the mounting areas in the first high-frequency processing section, and the second high-frequency processing section.

According to the present invention, noise can be prevented from entering the first high-frequency processing section from the system section and the power section; therefore, the present invention has excellent high-frequency characteristics. Furthermore, in the present invention, the circuit substrate is provided with a core layer that functions as a ground, and electronic components are arranged in through-holes or recessed portions formed in this core layer. Therefore, it is possible to have a higher mounting density and possible for the embedded electronic components to have high shielding characteristics. In the present invention, the circuit substrate has a core layer, and thus, heat generated by the respective functional parts is transmitted to the core layer and then dispersed in the plane direction of this core layer. This increases heat dissipation efficiency. In the present invention, a sealing member that covers the electronic components is formed on one entire surface of the circuit substrate. Therefore, this sealing member allows for a high heat dissipation efficiency. In the present invention, the circuit substrate has a core layer; therefore, the circuit substrate is not susceptible to warping, and such warping of the circuit substrate can be suppressed by selecting an appropriate sealing member. A communication module according to the present invention as described above can prevent characteristic degradation of high-frequency circuits, have high heat dissipation efficiency, and be resistant to warping regardless of many of the necessary primary function parts of the mobile phone being mounted together.

An example of a preferred embodiment of the present invention is a configuration in which the power circuit section includes a first power circuit area that powers the first high-frequency processing section, and a second power circuit area that powers the first power circuit area, and wherein a second shield wall is provided that fills a groove formed from the main surface of the sealing member to the main surface side of the circuit substrate, the groove demarcating a mounting area of the first power circuit area and a mounting area of the second power circuit area, the second shield wall being electrically connected to the above-mentioned shield layer.

Furthermore, in the present invention, many of the primary components necessary for the mobile phone are mounted together in a single module, thereby making it possible to achieve high functionality and a compact size. Grooves are formed in a sealing member on a primary surface of the circuit substrate, which is the component mounting surface, in order to demarcate one or both mounting areas of the system section and power circuit section and the mounting area of the first high-frequency processing section. A first shield wall is filled into this groove. Therefore, noise can be prevented from entering the first high-frequency processing section from the system section and the power circuit section, which allows for excellent high frequency characteristics. The present invention also has excellent high-frequency characteristics due to noise being prevented from entering the second high-frequency processing section from the system section and the power circuit section by a third shield wall. In addition, in the present invention, the sealing member that covers the electronic components is formed over the entire surface of the primary surface of the circuit substrate, thus allowing for high heat dissipation efficiency by the sealing member. Warping of the circuit substrate can also be suppressed if a suitable sealing member is selected. Despite the communication module of the present invention described above having many of the primary components necessary for a mobile phone mounted together, it is still possible to prevent characteristic degradation of the high-frequency circuits, to have a high heat dissipation efficiency, and to mitigate warping.

In another aspect, the present invention provides a communication module, including: a circuit substrate having (a) a first high-frequency processing section that processes high-frequency signals related to mobile phone communication and a second high-frequency processing section that is included with the circuit substrate and that processes high-frequency signals related to non-mobile phone communication; (b) a system section having a baseband processing area that processes baseband signals related to mobile phone communication and an application processing area that processes various types of mobile phone application operations, (c) a power circuit section; a sealing member formed on an entire surface of a main surface of the circuit substrate, the sealing member covering electronic components mounted on said main surface; a shield layer that is conductive and formed on a surface of the sealing member; a first shield wall that fills a groove formed from a main surface of the sealing member toward the main surface of the circuit substrate, the groove demarcating a mounting area of either one or both of the system section and the power circuit section and a mounting area of the first high-frequency processing section, the first shield wall being connected to the shield layer; and a second shield wall that fills a groove formed from the main surface of the sealing member toward the main surface of the circuit substrate, the groove demarcating a mounting area of either one or both of the system section and the power circuit section and a mounting area of the second high-frequency processing section, the second shield wall being connected to the shield layer.

An example of a preferred embodiment of the present invention is a configuration provided with: a third high-frequency processing section that is mounted on the circuit substrate and processes high-frequency signals related to non-mobile phone communication; and a fourth shield wall that fills a groove formed from the main surface of the sealing member to the main surface side of the circuit substrate, the groove demarcating one or both mounting areas of the system section and power circuit section and a mounting area of the third high-frequency processing section. This can prevent noise from entering the third high-frequency processing section from the system section and the power circuit section; thus, a configuration with excellent high-frequency characteristics is achieved.

An example of a preferred embodiment of the present invention is a configuration in which the mounting area of the system section is arranged between the mounting area of the first high-frequency processing section and the mounting area of the third high-frequency processing section.

Generally, the antenna used for mobile phone communication and the antenna used for non-mobile phone communication, such as for WiFi (registered trademark) communication or Bluetooth (registered trademark) communication, for example, are mounted as far away from each other as possible inside the casing of the mobile phone in order to prevent interference between the two. In the present invention, the mounting area of the system section is interposed between the mounting area of the first high-frequency processing section for mobile phone communication and the mounting area of the third high-frequency processing section for non-mobile phone communication; therefore, the distance between the mounting area of the first high-frequency processing section and the mounting area of the third high-frequency processing section will inevitably be large. This makes it easy to mount the antennas as described above, and such a configuration will have excellent high-frequency characteristics due to the wiring length between the respective antennas and the high-frequency circuits being able to be shortened.

One example of a preferred aspect of the present invention includes a configuration in which the circuit substrate is constituted of conductive layers and insulating layers stacked together and a core layer, which is a conductive layer, has a greater thickness than the other conductive layers and functions as ground. Furthermore, at least one of the electronic components that forms at least the first high-frequency processing section, the second high-frequency processing section, the system section, or the power circuit section is arranged in a through-hole or recessed portion that is formed in the core layer of the circuit substrate.

Furthermore, in the present invention, the circuit substrate is provided with a core layer that functions as ground, and electronic components are arranged in through-holes or recessed portions formed in this core layer. Therefore, it is possible to have a higher mounting density and possible for the embedded electronic components to have high shielding characteristics. In the present invention, the circuit substrate has a core layer, and thus, heat generated by the respective functional parts is transmitted to the core layer and then dispersed in the plane direction of this core layer. This increases heat dissipation efficiency. In the present invention, the circuit substrate has the core layer; therefore, the circuit substrate is less susceptible to warping, and warping of the circuit substrate can be even further suppressed by choosing a suitable sealing material.

As described above, a communication module according to the present invention can prevent characteristic degradation of high-frequency circuits, have high heat dissipation efficiency, and be resistant to warping regardless of many of the primary function parts necessary for the mobile phone being mounted together. The communication module of the present invention is not susceptible to warping, is made compact with ease, and has excellent mounting characteristics.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Embodiment 1

Figure 1:
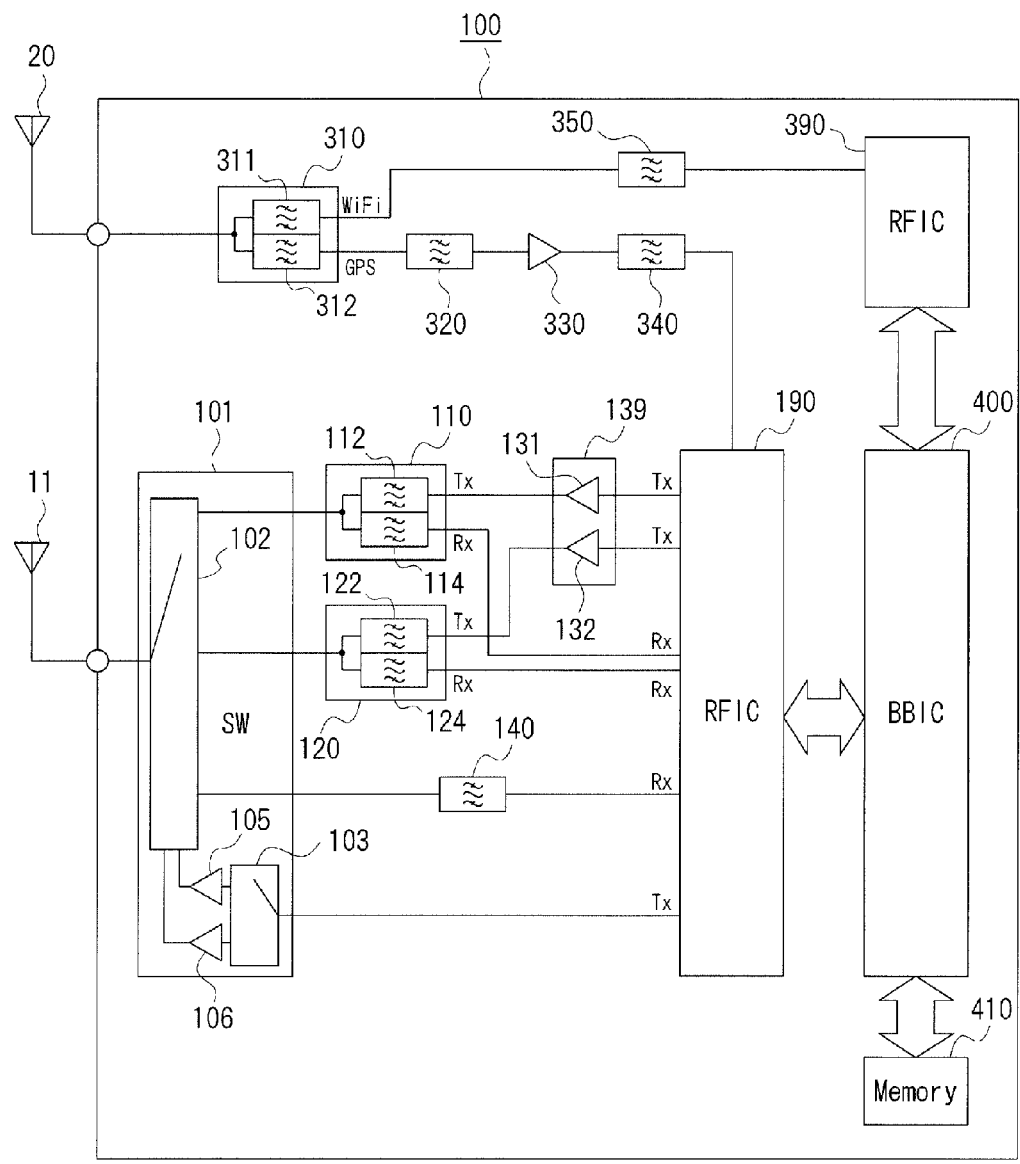
FIG. 1 is a schematic circuit diagram of a communication module according to Embodiment 1.

A communication module according to Embodiment 1 of the present invention will be explained with reference to figures. FIG. 1 is a schematic block view of the communication module. In the present embodiment, for ease of explanation, main configurations relating to the gist of the present invention will be explained.

A communication module 100 of the present embodiment has the primary functions of the multi-functional mobile phone, the smartphone, integrated into a single module. Specifically, the communication module 100 is provided with various functions such as speech communication on the mobile phone network, which is a broadband wireless communication network, WiFi (registered trademark), which is a form of short-range wireless communication, Bluetooth (registered trademark), and GPS, which is a satellite positioning system. For ease of explanation, the communication module 100 of the present embodiment is assumed to operate in the two W-CDMA (Wideband Code Division Multiple Access) frequency bands, two LTE (Long Term Evolution) frequency bands, and the two GSM (Global System for Mobile Communications) frequency bands.

As shown in FIG. 1, the communication module 100 includes a mobile phone network transceiver circuit. Specifically, the communication module 100 includes a high-frequency switch 101, first and second duplexers 110 and 120, high-frequency power amplifiers 131 and 132, and a first band-pass filter 140 as front end components. The communication module 100 also includes an RFIC (radio frequency integrated circuit) 190. As described later, the RFIC 190 processes GPS reception signals in addition to high-frequency signals related to mobile phone communication. The RFIC 190 is provided with a reception circuit and transmission circuit for high-frequency signals related to mobile phone communication, and performs modulation and demodulation of the high-frequency signals, and the like.

The communication module 100 also has a diplexer 310, second band-pass filter 320, low-noise amplifier 330, and third band-pass filter 340 as GPS front end components. A fourth band-pass filter 350 is provided as a WiFi front end component. As shown in FIG. 1, the diplexer 310 is also a front end component for WiFi and Bluetooth functionality. The communication module 100 also has an RFIC 390 for WiFi communication.

The communication module 100 further includes a memory 410, and a baseband IC 400, which is the central computing device responsible for processing functions (so-called baseband functions) of digital signals related to the respective communications and various types of application functions (such as camera control and imaging data processing) for the mobile phone.

In addition to the circuit components described above, the communication module 100 also has power circuits, clock circuits that form a reference for digital processing, and the like described later. These have been omitted in FIG. 1. The communication module 100 may be provided with front end components and RFIC for forming a diversity reception circuit and a two-system synchronous communication transceiver circuit as other primary components for high-frequency signal processing.

The high-frequency switch 101 has two embedded switches 102 and 103 and two high-frequency power amplifiers 105 and 106 in one package. The embedded switch 102 switches connection between an external antenna 11 and the first duplexer 110, second duplexer 120, first band-pass filter 140, and high-frequency power amplifiers 105 and 106. The embedded switch 103 switches connection between the two high-frequency power amplifiers 105 and 106 and the RFIC 190. The high-frequency power amplifier 105 amplifies transmission signals in the GSM frequencies that are greater than or equal to 1 GHz. The high-frequency power amplifier 106 amplifies transmission signals in the GSM frequencies that are less than 1 GHz. The embedded switch 103 is connected to the GSM transmission port of the RFIC 190. The transmission port is the same for the GSM 900 MHz band and 1900 MHz band.

The duplexers 110 and 120 are provided with respective transmission filters 112 and 122 and reception filters 114 and 124. Various types of acoustic wave filters such as SAW (surface acoustic wave) filters and BAW (bulk acoustic wave) filters can be used for the transmission filters 112 and 122 and the reception filters 114 and 124. In the present embodiment, SAW filters are used for the respective filters. In the present embodiment, the duplexers 110 and 120 use a configuration in which the respective transmission filters 112 and 122 and reception filters 114 and 124 are housed in a single package.

The transmission filters 112 and 122 are connected to the W-CDMA and LTE transmission ports of the RFIC 190 via the high-frequency power amplifiers 131 and 132. The respective reception filters 114 and 124 are connected to the reception ports of the RFIC 190. In the present embodiment, the reception filter 114 is connected to the W-CDMA and LTE reception port, and the reception filter 124 is connected to the W-CDMA, LTE, and GSM reception port. In the present embodiment, the high-frequency power amplifiers 131 and 132 are integrated into a single package as a power amp IC 139. The first band-pass filter 140 is connected to the GSM reception port of the RFIC 190. Various types of filters can be used for the first band-pass filter 140, including an acoustic wave filter such as a SAW filter or a BAW filter. In the present embodiment, a SAW filter is used for the band-pass filter.

As described above, the communication module 100 of the present embodiment operates in the two W-CDMA frequency bands, the two LTE frequency bands, and the two GSM frequency bands, and the duplexers 110 and 120 and band-pass filter 140 only allow high-frequency signals in these respective frequencies to pass through.

Specifically, the first duplexer 110 operates in the 2100 MHz W-CDMA (Wideband Code Division Multiple Access) and LTE (Long Term Evolution) bands. Accordingly, the first transmission filter 112 is a band-pass filter operating from 1920 to 1980 MHz, and the first reception filter 114 is a band-pass filter operating from 2110 to 2170 MHz. Meanwhile, the second duplexer 120 operates in the 900 MHz band of W-CDMA, LTE, and GSM. Accordingly, the second transmission filter 122 is a band-pass filter that operates in 880 to 915 MHz, and the second reception filter 124 is a band-pass filter that operates in 925 to 960 MHz.

The first band pass filter 140 is for filtering reception signals in the GSM 1900 MHz band and operates in 1930 to 1990 MHz.

The diplexer 310 is a device for branching high-frequency signals transmitted and received by an antenna 20 into high-frequency signals related to GSP reception signals and WiFi communication. The diplexer 310 includes a band-pass filter 312 that only allows GPS reception signals to pass through and a band-pass filter 311 that only allows high-frequency signals related to WiFi communication to pass through. In the present embodiment, the diplexer 310 has a configuration in which the band-pass filters 311 and 312 are housed in a single package. The diplexer 310 may be formed of a low-pass filter that allows GPS reception signals to pass while not allowing high-frequency signals related to WiFi communication to pass, and a high-pass filter that allows high-frequency signals related to WiFi communication to pass while not allowing GPS reception signals to pass.

The second band-pass filter 320 and third band-pass filter 340 are each filters for only allowing GPS reception signals to pass through. Various types of filters can be used for the respective band-pass filters 320 and 340, including an acoustic wave filter such as a SAW filter or a BAW filter. In the present embodiment, SAW filters are used for the respective filters. The third band-pass filter 340 is connected to the reception port of the RFIC 190. In the present embodiment, GPS front end components are configured as described above due to the weakness of the GPS reception signal and, as described later, the large distance between the terminal for connecting the antenna 20 and the RFIC 190; by introducing the low noise amplifier 330 together with the low-loss second band-pass filter 320, and by arranging these near the terminal for the antenna 20, good reception can be secured. Since the priority for the second band-pass filter 320 is to be low loss, it is difficult to ensure sufficient out-of-band suppression. As a countermeasure, in the present embodiment the third band-pass filter 340 with high out-of-band suppression is added.

The fourth band-pass filter 350 only allows high-frequency signals related to WiFi and Bluetooth to pass through. The fourth band-pass filter 350 is connected to the input/output port of the RFIC 390.

Figure 2:
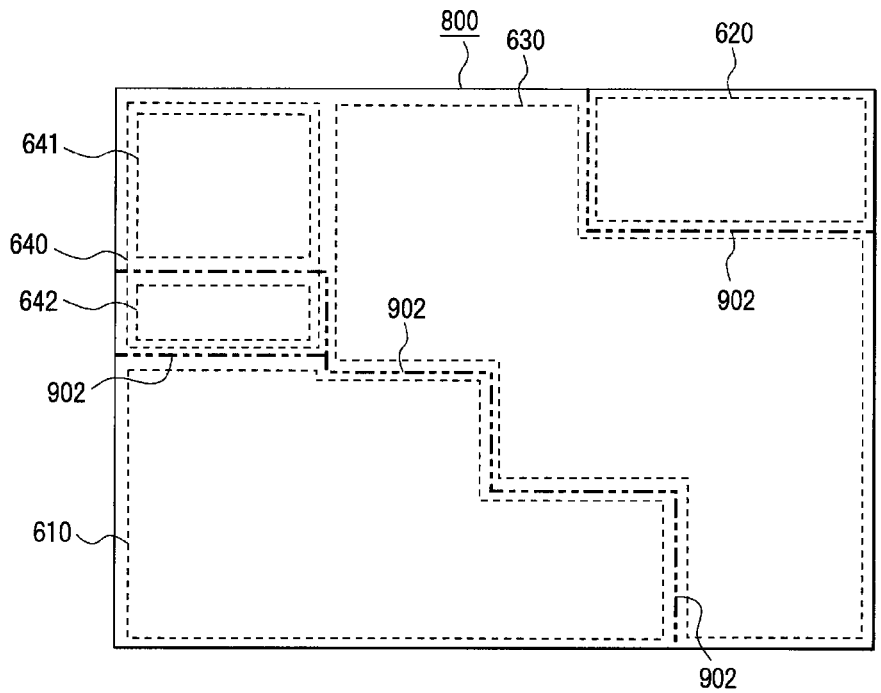
FIG. 2 is a plan view showing arrangement of respective functional blocks in the communication module according to Embodiment 1.

The communication module 100 of the present embodiment has various types of components mounted on one main surface of a circuit substrate 800, and several components are embedded in the circuit substrate 800. The component mounting surface of the circuit substrate 800 is sealed with a sealing member such as a resin. A terminal electrode and ground electrode are formed on the other main surface of the circuit substrate 800. The communication module 100 is used with the other main surface of the circuit substrate 800 facing the parent circuit substrate where the communication module is to be mounted, and the terminal electrode and ground electrode being connected to the parent circuit substrate by a method such as soldering. The structure of the communication module 100 will be described below with references to FIGS. 2 and 3. FIG. 2 is a plan view showing arrangement of the respective functional blocks of the communication module, and FIG. 3 is a plan view of a state in which the sealing member has been removed, as seen from the component mounting surface of the communication module.

Figure 3:
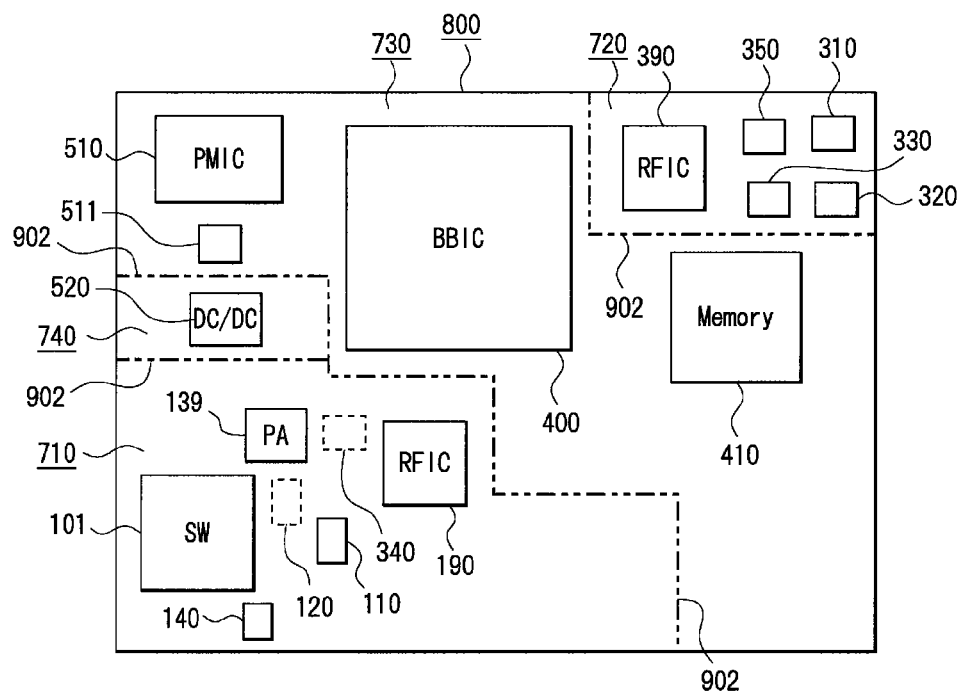
FIG. 3 is a plan view of a state in which a sealing member has been removed, as seen from the component mounting surface of the communication module according to Embodiment 1.

As shown in FIGS. 2 and 3, the communication module 100 is functionally demarcated into: a first high-frequency processing section 610 formed on the lower left side of the horizontally long rectangular circuit substrate 800, which is where the mobile phone high-frequency circuits are mounted; a second high-frequency processing section 620 formed on the upper right of the circuit substrate 800, which is where the non-mobile phone high-frequency circuits are mounted; a system section 630 arranged from the center of the circuit substrate 800 to the top and to the right and where the baseband processing functions and application processing functions are mounted; and a power circuit section 640 that supplies power to each section, formed on the upper left of the circuit substrate 800.

The first high-frequency processing section 610 is adjacent to the system section 630 and the power circuit section 640. As shown in FIG. 3, the high-frequency switch 101, duplexers 110 and 120, power amp IC 139, first band-pass filter 140, and RFIC 190 described above are provided in the first high-frequency processing section 610. The third band-pass filter 340, which is one of the non-mobile phone high-frequency circuit components, is also provided in the first high-frequency processing section 610. The high-frequency switch 101, first duplexer 110, power amp IC 139, and RFIC 190 are mounted on the surface of the circuit substrate 800. Meanwhile, the second duplexer 120 and third band-pass filter 340 are embedded in the circuit substrate 800. A terminal (not shown) for connecting with the antenna 11 is formed on the bottom of the first high-frequency processing section 610 in the circuit substrate 800. As described above, if the RFIC and front end components for forming the diversity reception circuit and two-system synchronous communication transceiver are provided, then the transceiver circuit may be disposed in the first high-frequency processing section 610.

As shown in FIG. 2, the second high-frequency circuit section 620 is only adjacent to the system section 630. In other words, the second high-frequency processing section 620 is not adjacent to the first high-frequency processing section 610 or the power circuit section 640. As shown in FIG. 3, the diplexer 310, second band-pass filter 320, low-noise amplifier 330, fourth band-pass filter 350, and RFIC 390 described above are mounted on the surface of the second high-frequency processing section 620. A terminal (not shown) for connecting with the antenna 20 is formed on the bottom of the second high-frequency processing section 620 in the circuit substrate 800.

As shown in FIG. 2, the system section 630 is adjacent to the first high-frequency processing section 610, second high-frequency processing section 620, and power circuit section 640. It should be noted that the system section 630 is between the first high-frequency processing section 610 and second high-frequency processing section 620. As shown in FIG. 3, the baseband IC 400 and memory 410 described above are mounted on the surface of the system section 630. It should be noted that the baseband functions and application functions are integrated into the baseband IC 400.

As shown in FIG. 2, the power circuit section 640 is functionally demarcated into a first power circuit area 641 that supplies power to the system section 630 and second high-frequency processing section 620, and a second power circuit area 642 that supplies power to the first high-frequency processing section 610. The first power circuit area 641 is adjacent to the system section 630 and second power circuit area 642, but not adjacent to the first high-frequency processing section 610 or second high-frequency processing section 620. Meanwhile, the second power circuit area 642 is adjacent to the system section 630, first power circuit area 641, and first high-frequency processing section 610, but not adjacent to the second high-frequency processing section 620. As shown in FIG. 3, various types of electronic components are mounted on the first power circuit area 641, such as a conventional power management IC 510 for the main power supply, a system clock oscillator 511, and an inductor for switching processing (not shown). Various types of electronic components are mounted on the second power circuit area 642, such as a conventional DC/DC converter 520 and an inductor (not shown) for switching processing of the DC/DC converter 520.

As shown in FIG. 2, the communication module 100 of the present embodiment has each section functionally demarcated, but these sections are also electrically and physically demarcated. In the present embodiment, the communication module 100 is demarcated into a first area 710 where the first high-frequency processing section 610 is formed, a second area 720 where the second high-frequency processing section 620 is formed, a third area 730 where the first power circuit area 641 of the power circuit section 640 and the system section 630 are formed, and a fourth area 740 where the second power circuit area 642 of the power circuit section 640 are formed. As described later, after the various components mounted on the surface of the circuit substrate 800 are sealed with a sealing member such as a resin, grooves are formed in the sealing member that reach the surface of the circuit substrate 800 so as to demarcate the respective areas 710 to 740. The entire surface of the sealing member is covered with a conductive material to form a shield layer, and a conductive material is also filled into the grooves to form shield walls 902. This demarcates the respective areas 710 to 740. A ground electrode set as the reference potential (ground potential) is formed on the surface of the circuit substrate 800 corresponding to the formation positions of the shield walls 902 in order to electrically connect with the shield walls 902.

The shield wall 902 has better thermal conductivity than the sealing member. From the viewpoint of heat dissipation, it is preferable that the shield wall 902 be closer to electronic components that generate large amounts of heat. Namely, it is preferable that the thickness of the sealing member between the shield wall 902 and the electronic component that generates large amounts of heat be as small as possible. In this manner, it is preferable that the distance between the electronic component with the largest amount of heat generation and the shield shall 902 be shorter than the distance between the other primary electronic components that generate heat and the shield wall 902. The "distance" between the electronic components and the shield wall 902 means the distance between the respective faces of the shield wall 902 and the electronic components that oppose each other therethrough. It also means the distance between the center or highest heat generating point of the electronic components and the wall face of the shield wall 902. In the present embodiment, the baseband IC 400 has the largest amount of heat generation. Thus, the baseband IC 400 is mounted such that the distance between the shield wall 902 and the baseband IC 400 is shorter than the distance between the power management IC 510, the RFIC 190, or the other primary heat generating electronic components and the shield wall 902.

It is preferable that the number of other mounted electronic components between the electronic component that has the largest amount of heat generation and the shield wall 902 facing this electronic component be small, and further preferable that other electronic components not be mounted in this area at all. This makes it possible to reduce the thickness of the sealing member between the electronic component with the largest amount of heat generation and the shield wall 902, thereby improving heat dissipation characteristics.

It is preferable that the electronic component with the largest amount of heat generation be taller with respect to the circuit substrate 800 than the other primary electronic components that generate heat. In other words, it is preferable that the thickness of the sealing member above the electronic component with the largest amount of heat generation be less than the thickness of the sealing member above the other primary electronic components that generate heat. In the present embodiment, the baseband IC 400 is taller with respect to the circuit substrate 800 than the power management IC 510, the RFIC 190, and the like, which are other primary electronic components that generate heat.

In order to prevent localized increases in temperature, it is preferable that a plurality of the electronic components with large amounts of heat generation be mounted at prescribed distances from each other so as not to be in contact. In other words, it is preferable that electronic components with small amounts of heat generation be mounted between the plurality of electronic components with large amounts of heat generation. Alternatively, it is preferable that the electronic components be mounted such that the respective shield walls 902 are arranged between the plurality of electronic components with large amounts of heat generation. In the present embodiment, examples of the electronic components with large amounts of heat generation include the baseband IC 400, the RFIC 190, the RFIC 390, the power management IC 510, and the power amp IC 139. The communication module 100 of the present embodiment has high heat dissipation characteristics due to the configuration above, and thus, it is possible for the communication module 100 to have a higher density, and by extension, to be made more compact.

Figure 4:
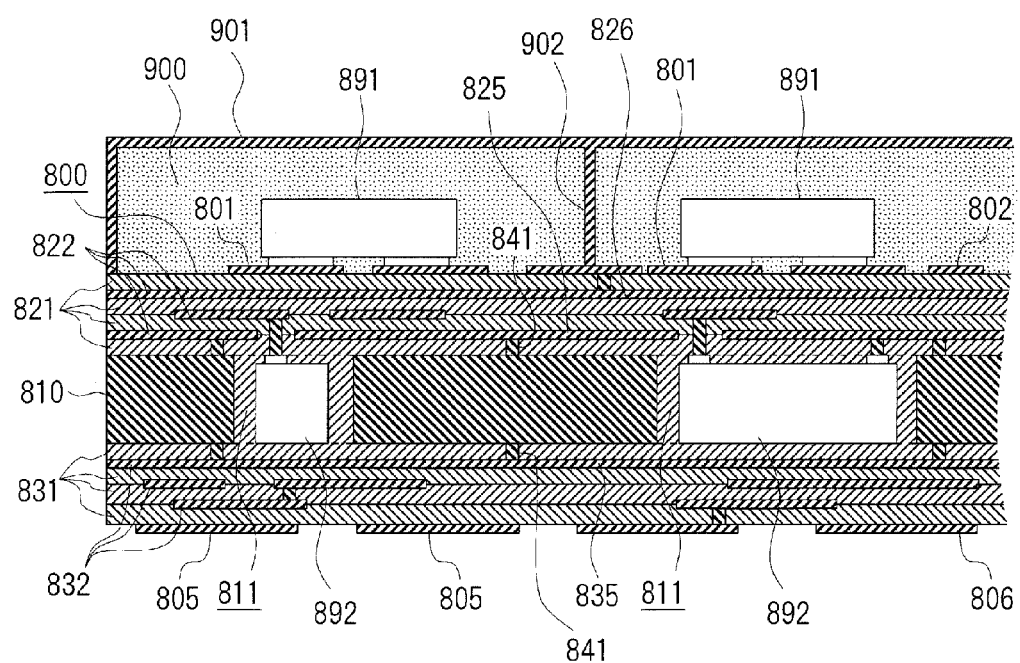
FIG. 4 is a cross-sectional view of the communication module according to Embodiment 1.

Next, the structure of the circuit substrate will be explained with reference to FIG. 4. FIG. 4 is a cross-sectional view of the communication module. The circuit substrate 800 is a multilayer substrate formed by alternately stacking insulating layers and conductive layers. As shown in FIG. 4, the circuit substrate 800 includes a core layer 810 that is a relatively thick metal conductive layer with good conductive characteristics, a plurality of insulating layers 821 and conductive layers 822 formed on one main surface (top surface) of the core layer 810, and a plurality of insulating layers 831 and conductive layers 832 formed on the other main surface (bottom surface) of the core layer 810. The insulating layers 821 and 831 and the conductive layers 822 and 832 are formed on both main surfaces of the core layer 810 using the build-up method. Two of the conductive layers 822 positioned between the core layer 810 and one main surface (top surface) of the circuit substrate 800 act as ground conductive layers 825 and 826 provided with a reference potential (ground), and one layer of the conductive layers 832 between the core layer 810 and other main surface (bottom surface) of the circuit substrate 800 also acts as a ground conductive layer 835. The ground conductive layers 825 and 835 are the closest conductive layers 822 and 832 to the core layer 810, and each is connected to the core layer 810 through via conductors 841. Accordingly, the core layer 810 also functions as a ground conductor. There is also a conductive layer 822 between the two ground conductive layers 825 and 826, and the wiring line formed in this conductive layer 822 can be made to function as a strip line. Conductive lands 801 for component mounting and wiring 802 are formed on one main surface (the top surface) of the circuit substrate 800. Terminal electrodes 805 and ground electrodes 806 for connecting to a mother board are formed on the other main surface (bottom surface) of the circuit substrate 800. Surface mounted components 891 such as the RFIC 190 and baseband IC 400 are soldered to the lands 801.

Through-holes 811 for housing components are formed in the core layer 810. Embedded electronic components 892 such as the passive components such as the SAW filters, capacitor, and inductor, and active components such as the power amp IC are arranged inside the through-holes 811. In the present embodiment, the second duplexer 120 and third band-pass filter 340 are arranged inside the through-holes 811. Accordingly, it is preferable that the core layer 810 be thicker than the height of the embedded electronic components 892. In the present embodiment, the core layer 810 is made of a metal plate, or more specifically a metal plate made of a copper or a copper alloy. Spaces around the stored components in the through-holes 811 are filled with an insulating member such as a resin.

A sealing member 900 that seals the surface mounted components 891 is formed on the top of the circuit substrate 800, or namely, the component mounting surface. An example of the material for the sealing member 900 is an insulating resin such as an epoxy resin with silica or alumina added. The conductive shield layer 901 is formed on the surface of the sealing member 900. The shield wall 902 for demarcating the respective areas 710 to 740 described above is formed integrally with the shield layer 901 in the sealing member 900. The bottom end of the shield wall 902 is connected with the ground electrode on top of the circuit substrate 800.

As described above, according to the communication module 100 of the present embodiment, many of the primary function parts necessary for a mobile phone can be integrated on a single communication module, thereby allowing for high-functionality and a decrease in size. In the present embodiment, the shield wall 902 is formed in the sealing member 900, which is formed on one main surface that is a component mounting surface of the circuit substrate 800, so as to demarcate the first high-frequency processing section 610, the system section 630, and the power circuit section 640. This can prevent noise from entering the first high-frequency processing section 610 from the system section 630 and the power circuit section 640; thus, a configuration with excellent high-frequency characteristics is achieved. In the present embodiment, in a similar manner, the shield wall 902 is formed so as to demarcate the second high-frequency processing section 620 and the system section 630, resulting in a configuration with even greater high-frequency characteristics. In the present embodiment, in a similar manner, the shield wall 902 is formed so as to demarcate the first power circuit area 641 and second power circuit area 642, resulting in a configuration with even greater high-frequency characteristics.

In the present embodiment, the circuit substrate 800 includes the core layer 810 functioning as a ground, and electronic components are arranged inside the through-holes 811 formed in the core layer 810. Therefore, a configuration is provided that has a higher mounting density and in which the embedded electronic components have high shielding characteristics. In the present embodiment, the circuit substrate 800 includes the core layer 810; thus, heat generated by the respective function parts is transmitted to the core layer 810 and diffused in the plane direction in the core layer 810. This increases heat dissipation efficiency. In the present embodiment, the sealing member 900 covering the electronic components is formed on one entire surface of the circuit substrate 800. Therefore, a high heat dissipation efficiency can be achieved due to the sealing member 900.

In the present embodiment, the circuit substrate 800 includes the core layer 810, and therefore, the circuit substrate 800 is not susceptible to warping, and selecting a suitable sealing member 900 makes it possible to suppress warping of the circuit substrate.

In the communication module of the present embodiment, most of the primary function sections that are necessary for a mobile phone are mounted together on a single communication module; therefore, it is no longer necessary to arrange other modules or electronic components on the motherboard, which is the mounting location of the communication module, or alternatively it is possible to only mount a very small number of other modules or electronic components on the motherboard. Therefore, the mounting efficiency of the product is improved and a flexible printed wiring board can be used as the motherboard with ease. The use of a flexible printed wiring board allows the product to be made smaller and thinner. When using a flexible printed wiring board as the motherboard, it is possible to extend a portion of the motherboard and connect this extended end to an external component such as a display device, for example. This makes it unnecessary to have a connector for the motherboard, thereby enabling the product to be made smaller and thinner.

As described above, the communication module 100 according to the present embodiment can prevent characteristic degradation of the high-frequency circuit, have high heat dissipation efficiency, and be resistant to warping regardless of many of primary function parts necessary for the mobile phone being integrated. The communication module of the present invention is not susceptible to warping, is made compact with ease, and has excellent mounting characteristics.

Embodiment 2

Figure 5:
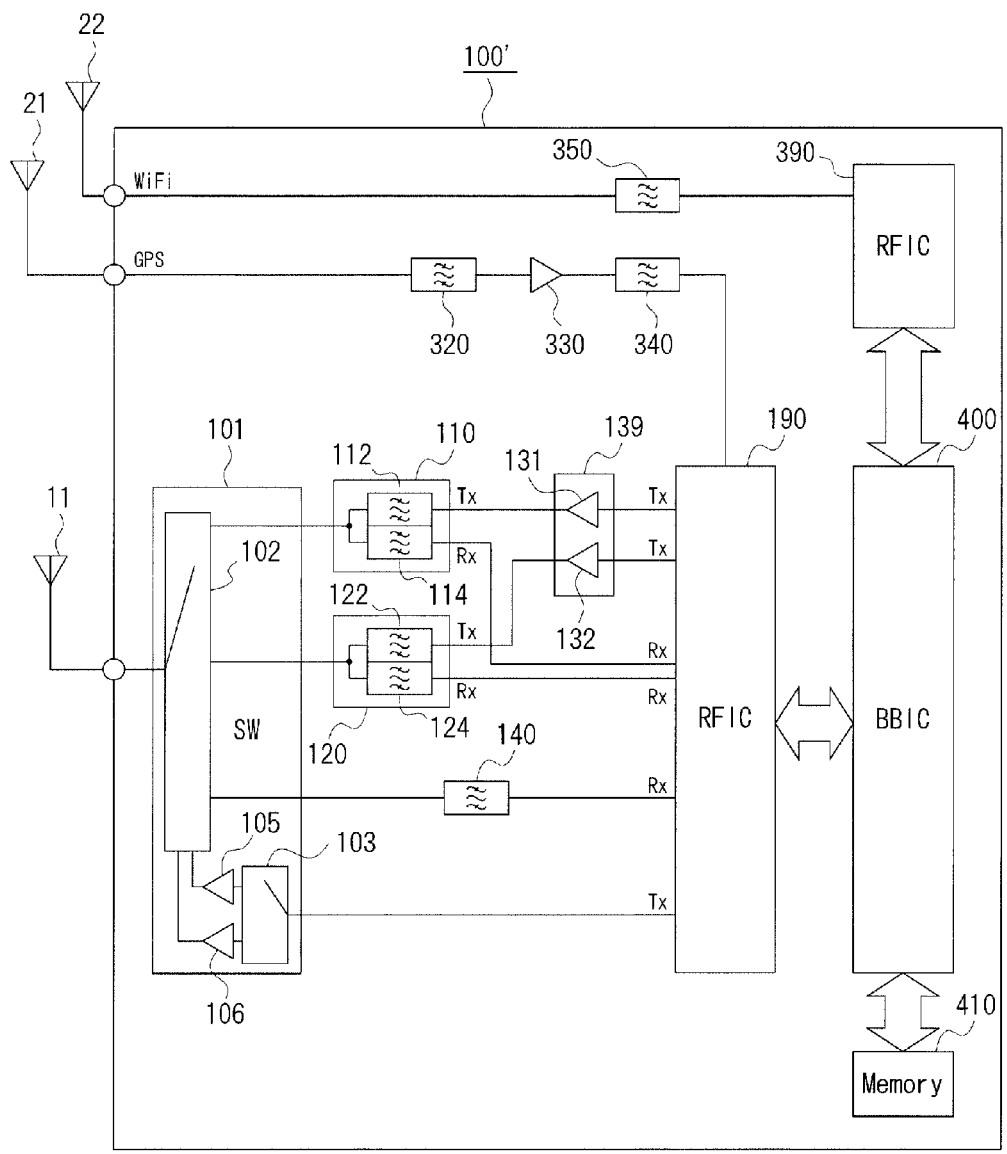
FIG. 5 is a cross-sectional view of a communication module according to Embodiment 2.

A communication module according to Embodiment 2 of the present invention will be explained with reference to figures. FIG. 5 is a schematic block view of the communication module. In the present embodiment, for ease of explanation, main configurations relating to the gist of the present invention will be explained. In the present embodiment, elements that are similar to those in Embodiment 1 are given the same reference characters, and an explanation thereof will be omitted.

As shown in FIG. 5, one point in which a communication module 100' of the present embodiment differs from the communication module 100 in Embodiment 1 is that the diplexer 310 is omitted due to having a separate GPS antenna 21 and WiFi communication antenna 22 instead. The other circuit configurations are similar to Embodiment 1, and thus, an explanation thereof will be omitted.

Figure 6:
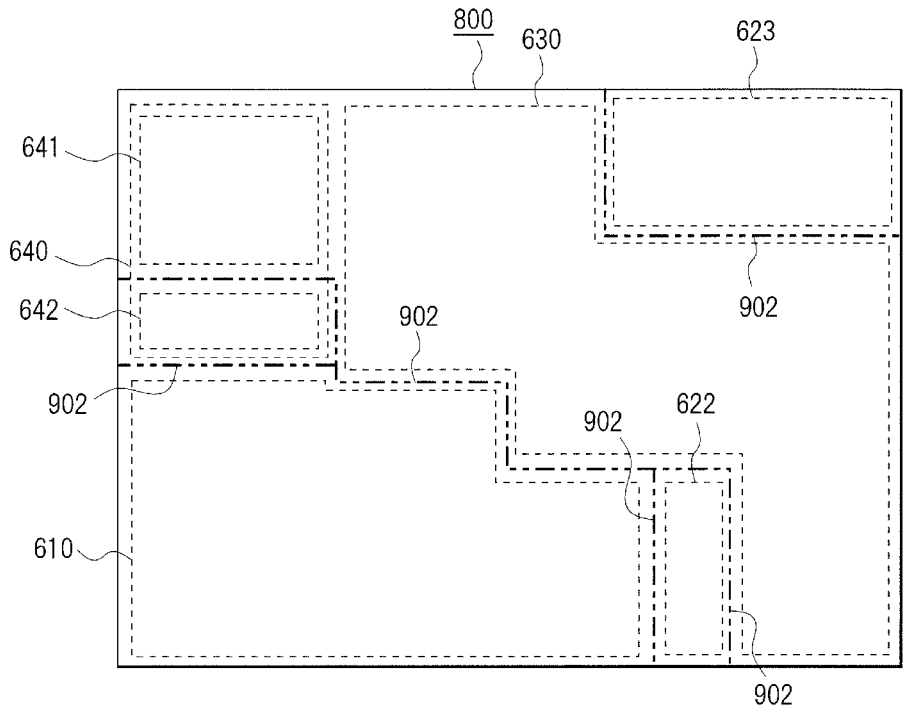
FIG. 6 is a plan view showing placement of functional blocks of the communication module according to Embodiment 2.

One point in which the communication module 100' of the present embodiment differs from the communication module 100 in Embodiment 1 is the mounting structure for a circuit substrate 800 of the respective electronic components. The mounting structure is explained below with reference to FIGS. 6 and 7. FIG. 6 is a plan view showing arrangement of the respective functional blocks of the communication module, and FIG. 7 is a plan view of a state in which the sealing member has been removed, as seen from the component mounting surface of the communication module.

Figure 7:
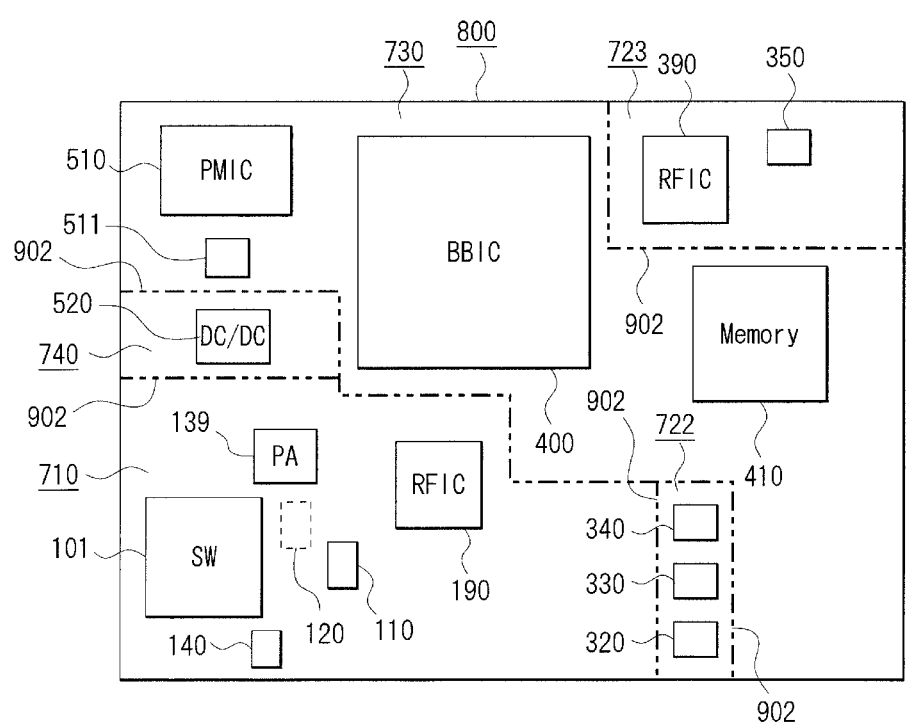
FIG. 7 is a plan view of the communication module according to Embodiment 2 as seen from the component mounting surface when the sealing member has been removed.

As shown in FIGS. 6 and 7, the communication module 100' is functionally demarcated into: a first high-frequency processing section 610 that is formed in the lower left side of the horizontally-long rectangular circuit substrate 800 and that is where high-frequency circuits for mobile phone use are mounted; a second high-frequency processing section 622 that is adjacent to the right side of the first high-frequency processing section 610 and that is where the high-frequency circuits for GPS use in particular are mounted, among the high-frequency circuits for non-mobile phone use; a third high-frequency processing section 623 that is formed in the upper right area of the circuit substrate 800 where the WiFi communication high-frequency circuits in particular are mounted, among the high-frequency circuits for non-mobile phone use; a system section 630 that is formed to the top and right of the center of the circuit substrate 800 where the baseband processing function and application processing function are mounted; and a power circuit section 640 that is formed in the upper left area of the circuit substrate 800 and that supplies power to the respective sections.

The first high-frequency processing section 610 is adjacent to the second high-frequency processing section 622, the system section 630, and the power circuit section 640. As shown in FIG. 7, a high-frequency switch 101, duplexers 110 and 120, power amp IC 139, first band-pass filter 140, and RFIC 190 are provided in the first high-frequency processing section 610. The high-frequency switch 101, the first duplexer 110, the power amp IC 139, and the RFIC 190 are mounted on the surface of the circuit substrate 800. Meanwhile, the second duplexer 120 is embedded in the circuit substrate 800. A terminal (not shown) for connecting with an antenna 11 is formed on the bottom of the second high-frequency processing section 610 in the circuit substrate 800. As described above, if the RFIC and front end components for forming a diversity reception circuit and two-system synchronous communication transceiver are provided, then the transceiver circuit may be disposed in the first high-frequency processing section 610.

As shown in FIG. 6, the second high-frequency processing section 622 is adjacent to the first high-frequency processing section 610 and the system section 630. As shown in FIG. 7, a second band-pass filter 320, a low-noise amplifier 330, and a third band-pass filter 340 are each mounted on the surface of the circuit substrate 800 in the second high-frequency processing section 622. A terminal (not shown) for connecting with an antenna 21 is formed on the bottom of the second high-frequency processing section 622 in the circuit substrate 800.

As shown in FIG. 6, a third high-frequency processing section 623 is only adjacent to the system section 630. In other words, the third high-frequency processing section 623 is not adjacent to the first high-frequency processing section 610, the second high-frequency processing section 622, or the power circuit section 640. As shown in FIG. 7, a fourth band-pass filter 350 and the RFIC 390 are mounted on the surface in the third high-frequency processing section 623. A terminal (not shown) for connecting with the antenna 22 is formed on the bottom of the third high-frequency processing section 623 in the circuit substrate 800.

As shown in FIG. 6, the system section 630 is adjacent to the first high-frequency processing section 610, the second high-frequency processing section 622, the third high-frequency processing section 623, and the power circuit section 640. It should be noted that the system section 630 is between the first high-frequency processing section 610 and the third high-frequency processing section 623. As shown in FIG. 7, a baseband IC 400 and memory 410 are mounted on the surface of the system section 630. It should be noted that the baseband functions and application functions are integrated into the baseband IC 400.

As shown in FIG. 6, the power circuit section 640 is functionally demarcated into: a first power circuit area 641 that supplies power to the system section 630, the second high-frequency processing section 622, and the third high-frequency processing section 623; and a second power circuit area 642 that supplies power to the first high-frequency processing section 610. The first power circuit area 641 is adjacent to the system section 630 and the second power circuit area 642, but not adjacent to the first high-frequency processing section 610, the second high-frequency processing section 622, or the third high-frequency processing section 623. Meanwhile, the second power circuit area 642 is adjacent to the system section 630, the first power circuit area 641, and the first high-frequency processing section 610, but not adjacent to the second high-frequency processing section 622 or the third high-frequency processing section 623. As shown in FIG. 7, various types of electronic components are mounted in the first power circuit area 641, such as a conventional power management IC 510 for the main power supply, a system clock oscillator 511, and an inductor for switching processing (not shown). Various types of electronic components are mounted in the second power circuit area 642, such as a conventional DC/DC converter IC 520 and an inductor (not shown) for switching processing of the DC/DC converter IC 520.

As shown in FIG. 6, the communication module 100' of the present embodiment has each section functionally demarcated, but these sections are also electrically and physically demarcated. As shown in FIG. 7, in the present embodiment the communication module 100' is demarcated into: a first area 710 where the first high-frequency processing section 610 is formed; a second area 722 where the second high-frequency processing section 622 is formed; a third area 723 where the third high-frequency processing section 623 is formed; a fourth area 730 where the first power circuit area 641 of the power circuit section 640 and the system section 630 are formed; and a fifth area 740 where the second power circuit area 642 of the power circuit section 640 is formed. As described later, after the various components mounted on the surface of the circuit substrate 800 are sealed with a sealing member such as a resin, grooves are formed in the sealing member that reach the surface of the circuit substrate 800 so as to demarcate the respective areas. The entire surface of the sealing member is covered with a conductive material to form a shield layer, and a conductive material is also filled into the grooves to form shield walls 902. This demarcates the respective areas 710 to 740. A ground electrode set at reference potential (ground potential) is formed on the surface of the circuit substrate 800 in a position corresponding to where the shield walls 902 are formed so as to be electrically connected to the shield walls 902.

The other constituting elements, design concept, and the like are similar to Embodiment 1. In other words, the relative distance between the shield walls 902 and the respective electronic components, the relationship of the heat generation of electronic components close to the shield walls 902, the design concepts with respect to the arrangement of the respective electronic components, the structure of the circuit substrate 800, and the like are similar to Embodiment 1.

According to the communication module 100' of the present embodiment, the second high-frequency processing section 622 where the GPS communication high-frequency processing circuit is mounted and the first high-frequency processing section 610 where the high-frequency circuits for mobile phone communication are mounted are demarcated by the respective shield walls 902; therefore, signals related to mobile phone communication can be prevented from interfering with GPS signals. In general, GPS communication signals are slightly weaker than mobile phone communication signals, and thus, the communication module 100' of the present embodiment is very useful for increasing the precision of and stabilizing the GPS. Other functions and effects are the same as in Embodiment 1.

Embodiments of the present invention were described above, but the present invention is not limited thereto. In the respective embodiments above, forming the core layer 810 of copper or a copper alloy was described as an example, but there is no limitation on the material, and other metals, alloys, or resins can be used. In the respective embodiments described above, the surface mounted components 891 were sealed by a sealing member 900 on the top of the circuit substrate 800, but a conductive case may be attached so as to cover the entire top surface or a portion of the top surface of the circuit substrate 800. In this case, a conductive partitioning wall is provided in the case so as to correspond with the shield wall 902.

Figure 8:
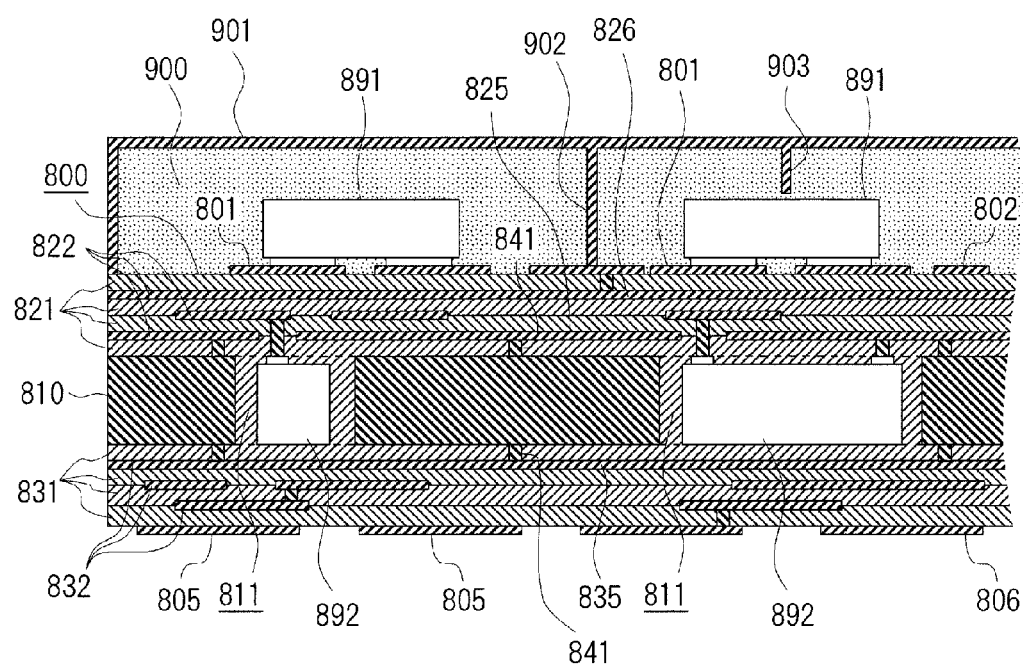
FIG. 8 is a cross-sectional view of a communication module according to a modification example.

In the respective embodiments described above, the shield wall 902 is provided that extends from the shield layer 901 on the surface of the sealing member 900 to the ground electrode above the circuit substrate 800 in order to electrically and physically demarcate the areas, but as shown in FIG. 8, a shield wall 903 may stretch from the shield layer 901 of the surface of the sealing member 900 to substantially the midpoint in the thickness direction of the sealing member 900. The shield wall 903 has slightly inferior electrical and physical shielding characteristics to the shield wall 902, but the surface mounted components 691 can be arranged under this shield wall 903. Accordingly, in the communication module 100 and 100' according to the respective embodiments described above, electrical characteristics can be improved while maintaining mounting density by appropriately adding the shield wall 903 without changing the shield wall 902, arrangement of the components, and the like. In the respective embodiments described above, the first power circuit area 641 of the power circuit section 640 and the system section 630 are mounted in the same area 730 demarcated by the shield wall 902, for example, but it is possible for the shield wall 903 to be formed so as to demarcate the first power circuit area 641 of the power circuit section 640 and the system section 630.

The circuits of the respective embodiments described above are merely examples, and the present invention can be implemented even with other circuit configurations. Furthermore, which components to embed may be chosen as appropriate in consideration of mounting density, shielding characteristics, heat dissipation characteristics, and the like.

The arrangements of the respective function parts in the respective embodiments described above are merely examples, and the present invention can be implemented even with other arrangement configurations. In the respective embodiments described above, the system section 630 was arranged between the first high-frequency processing section 610 and second high-frequency processing section 620, but the first high-frequency processing section 610 and second high-frequency processing section 620 may be adjacent. In this case, the shield wall 902 may be formed so as to electrically and physically demarcate the respective processing sections 610 and 620 as necessary.

In the respective embodiments described above, the first and second duplexers 110 and 120 have the respective transmission filters 112 and 122 and reception filters 114 and 124 housed in a single package, but each may use individual filters.

In the respective embodiments described above, the through-holes 811 are formed in the core layer 810, and electronic components such as the second duplexer 120 are arranged in these through-holes 811, but recessed portions may be formed in the core layer 810 instead of the through-holes 811, and the respective electronic components may be arranged in these recessed portions.

In the respective embodiments described above, the baseband functions, which are digital signal processing functions related to communication, and the various types of application functions of the mobile phone are integrated into the single baseband IC 400, but the respective functions may be mounted with separate ICs.

The frequency bands in the respective embodiments described above are merely examples, and the present invention can be implemented even with other frequency bands. The GPS described in the respective embodiments above is merely an example of a satellite positioning system, and the present invention can be implemented even with other satellite positioning systems such as Russia's GLONASS and China's Compass. In the respective embodiments described above, duplexers were included as examples of branching filters (antenna duplexers), but the present invention can be implemented even with a branching filter that has three or more pass frequency bands such as a triplexer.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A communication module, comprising:
   a circuit substrate having (a) a first high-frequency processing section that processes high-frequency signals related to mobile phone communication, (b) a system section having a baseband processing area that processes baseband signals related to mobile phone communication and an application processing area that processes various types of mobile phone application operations, and (c) a power circuit section that includes a first power circuit section that supplies power to the first high-frequency processing section and a second power circuit section that supplies power to the system section;
   a sealing member formed on an entire main surface of the circuit substrate, the sealing member covering electronic components mounted on said main surface;
   a shield layer that is conductive and formed on a surface of the sealing member;
   a first shield wall that fills a groove formed from a main surface of the sealing member toward the main surface of the circuit substrate, the groove demarcating a mounting area of either one or both of the system section and the power circuit section and a mounting area of the first high-frequency processing section, the first shield wall being connected to the shield layer; and
   a second shield wall that fills a groove formed from the main surface of the sealing member toward the main surface of the circuit substrate, the groove demarcating a mounting area of the first power circuit section and a mounting area of the second power circuit section, the second shield wall being connected to the shield layer.

2. The communication module according to claim 1, wherein a primary processing part of the baseband processing area and a primary processing part of the application processing area are integrated into one integrated circuit.

3. A communication module, comprising:
   a circuit substrate having (a) a first high-frequency processing section that processes high-frequency signals related to mobile phone communication and a second high-frequency processing section that is included with the circuit substrate and that processes high-frequency signals related to non-mobile phone communication, (b) a system section having a baseband processing area that processes baseband signals related to mobile phone communication and an application processing area that processes various types of mobile phone application operations, and (c) a power circuit section;
   a sealing member formed on an entire main surface of the circuit substrate, the sealing member covering electronic components mounted on said main surface;
   a shield layer that is conductive and formed on a surface of the sealing member;
   a first shield wall that fills a groove formed from a main surface of the sealing member toward the main surface of the circuit substrate, the groove demarcating a mounting area of either one or both of the system section and the power circuit section and a mounting area of the first high-frequency processing section, the first shield wall being connected to the shield layer; and
   a second shield wall that fills a groove formed from the main surface of the sealing member toward the main surface of the circuit substrate, the groove demarcating a mounting area of either one or both of the system section and the power circuit section and a mounting area of the second high-frequency processing section, the second shield wall being connected to the shield layer.

4. The communication module according to claim 3, wherein the mounting area of the system section is arranged between the mounting area of the first high-frequency processing section and the mounting area of the second high-frequency processing section.

5. The communication module according to claim 1, wherein the circuit substrate is made of conductive layers and insulating layers stacked together, and has a core layer that is a conductive layer, the core layer being thicker than other conductive layers and functioning as ground, and
   wherein one or more electronic components forming a part of at least one of the first high-frequency processing section, the system section, and the power circuit section are arranged in a through-hole or a recessed portion formed in the core layer of the circuit substrate.

6. The communication module according to claim 2, wherein the circuit substrate is made of conductive layers and insulating layers stacked together, and has a core layer that is a conductive layer, the core layer being thicker than other conductive layers and functioning as ground, and wherein one or more electronic components forming a part of at least one of the first high-frequency processing section, the system section, and the power circuit section are arranged in a through-hole or a recessed portion formed in the core layer of the circuit substrate.

7. The communication module according to claim 3, wherein the circuit substrate is made of conductive layers and insulating layers stacked together, and has a core layer that is a conductive layer, the core layer being thicker than other conductive layers and functioning as ground, and wherein one or more electronic components forming a part of at least one of the first high-frequency processing section, the system section, and the power circuit section are arranged in a through-hole or a recessed portion formed in the core layer of the circuit substrate.

8. The communication module according to claim 4, wherein the circuit substrate is made of conductive layers and insulating layers stacked together, and has a core layer that is a conductive layer, the core layer being thicker than other conductive layers and functioning as ground, and wherein one or more electronic components forming a part of at least one of the first high-frequency processing section, the system section, and the power circuit section are arranged in a through-hole or a recessed portion formed in the core layer of the circuit substrate.

* * * * *